United States Patent
Santraine et al.

(10) Patent No.: US 8,422,610 B2
(45) Date of Patent: Apr. 16, 2013

(54) IQ MISMATCH CORRECTION CIRCUIT

(75) Inventors: Arnaud Santraine, Osaka (JP); Pascal Lo Re, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 734 days.

(21) Appl. No.: 12/605,719

(22) Filed: Oct. 26, 2009

(65) Prior Publication Data

US 2010/0104045 A1 Apr. 29, 2010

(30) Foreign Application Priority Data

Oct. 27, 2008 (JP) ................................. 2008-275069

(51) Int. Cl.
*H04B 1/10* (2006.01)
(52) U.S. Cl.
USPC ............................ 375/350; 375/322; 375/233
(58) Field of Classification Search .................. 375/267, 375/299, 296, 317, 235, 322
See application file for complete search history.

(56) References Cited

U.S. PATENT DOCUMENTS

| | | | |
|---|---|---|---|
| 5,157,697 A | 10/1992 | Anvari et al. | |
| 5,705,949 A | 1/1998 | Alelyunas et al. | |
| 6,330,290 B1 | 12/2001 | Glas | |
| 6,898,252 B1 | 5/2005 | Yellin et al. | |
| 7,158,586 B2 | 1/2007 | Husted | |
| 7,274,750 B1 | 9/2007 | Mueller | |
| 7,298,793 B2 | 11/2007 | Wu et al. | |
| 7,466,251 B2* | 12/2008 | Uchino | ........................ 341/120 |
| 2006/0056546 A1* | 3/2006 | Hayase et al. | ................ 375/332 |
| 2008/0001806 A1* | 1/2008 | Uchino | ........................ 341/161 |
| 2011/0128992 A1* | 6/2011 | Maeda et al. | .................. 375/130 |

OTHER PUBLICATIONS

Koji Maeda et al., "Wideband Image-Rejection Circuit for Low-IF Receivers", ISSCC 2006, 26.1.

* cited by examiner

*Primary Examiner* — Tesfaldet Bocure
*Assistant Examiner* — Qutbuddin Ghulamali
(74) *Attorney, Agent, or Firm* — Birch, Stewart, Kolasch & Birch, LLP

(57) ABSTRACT

An IQ mismatch correction circuit comprises: a correction circuit which performs a correction process to I-phase and Q-phase input signals by using one pair of first- or higher-order digital filters; two or more control circuits which independently generate two or more control variables to derive two or more coefficients of transfer functions of the digital filters; and one or more pairs of analyzing filters which change frequency characteristics of the corrected I-phase and Q-phase output signals so that the frequency characteristics is different from those of the original signals. The first control circuit measures a temporally averaged IQ phase mismatch state between the I-phase and Q-phase output signals. The second control circuit measures a temporally averaged IQ phase mismatch state between output signals on I-phase and Q-phase sides of one pair of analyzing filters. These states are fed back to the digital filters as first and second control variables, respectively.

15 Claims, 10 Drawing Sheets

IQ MISMATCH CORRECTION CIRCUIT

CROSS REFERENCE TO RELATED APPLICATION

This Nonprovisional application claims priority under 35 U.S.C. §119(a) on Patent Application No. 2008-275069 filed in Japan on 27 Oct., 2008 the entire contents of which are hereby incorporated by reference.

BACKGROUND OF THE INVENTION

1. Field of the Invention

The present invention relates to a circuit which corrects a mismatch (phase error and amplitude error) between an I-phase (in-phase) signal and a Q-phase (quadrature) signal outputted from a quadrature receiver in a digital communication system.

2. Description of the Related Art

In a standard receiver in a wireless or wireline digital communication system, a high-frequency signal including modulated information is demodulated to extract a desired information signal. The extracted information signal, generally being a complex value, is called a baseband signal, and has an I-phase (in-phase) component and a Q-phase (quadrature) component. The I-phase and Q-phase signals are modulated on a carrier wave to be 90 degrees apart and to have orthogonality on a transmitter side. Furthermore, the I-phase and Q-phase signals generally have the same electric power characteristics and have orthonormality. An orthogonal receiver is generally used to extract a baseband signal from a received signal.

An orthogonal receiver 100, as shown in FIG. 9, includes a receiving interface 101 to receive a transmission signal transmitted from a transmitter side through a wireless or wireline communication channel, a circuit 102 to separate a reception signal SR outputted from the receiving interface 101 into two I-phase reception signal SRI and Q-phase reception signal SRQ which are orthogonal to each other, and low-pass filters 107 and 108 which remove high-frequency components from the I-phase reception signal SRI and the Q-phase reception signal SRQ. The circuit 102 includes two mixers 103 and 104, a local oscillator 105, and a phase shifter 106 which shifts a phase of an oscillation signal SOL in the local oscillator 105 by 90 degrees. The mixer 103 multiplies the reception signal SR by an oscillation signal SL in the local oscillator 105 to generate the I-phase reception signal SRI, and the mixer 104 multiplies the reception signal SR by an oscillation signal SLQ in the phase shifter 106 to generate the Q-phase reception signal SRQ. An I-phase baseband signal SI and a Q-phase baseband signal SQ outputted from the low-pass filters 107 and 108 are digitized by A/D converters 109 and 110, respectively, to generate I-phase and Q-phase digital baseband signals SDI and SDQ.

In an ideal communication link, theoretically, the digital baseband signals SDI and SDQ have complete orthonormality, and can be directly processed by a demodulation circuit suitable for a predetermined communication link.

However, in an actual circuit, various defects in a transmitter, a receiver, or both of them which are present on a transmission path lead to a loss of the orthonormality between the I-phase baseband signal SI and the Q-phase baseband signal SQ. In the loss of the orthonormality (referred to as "IQ mismatch"), the I-phase baseband signal SI and the Q-phase baseband signal SQ is considered to interfere with each other. Due to the IQ mismatch, severe distortion occurs between an original baseband signal on a transmitter side and a baseband signal outputted from a receiver. This distortion which damages the communication link in quality and usability, the loss of the orthogonality (phase mismatch or phase error), and an energy difference (gain mismatch or amplitude error) must be corrected to ensure that a distortion level at an output terminal of the receiver is kept within tolerance and is not detrimental to the quality and usability of the communication link.

FIGS. 10A and 10B show an example of quality deterioration of a reception signal by an IQ mismatch. FIGS. 10A and 10B show quality deterioration caused by an IQ mismatch in a PAL video signal. FIG. 10A shows an electric power spectrum density (PSD) of an ideal signal obtained before the IQ mismatch occurs, and FIG. 10B shows an electric power spectrum density of a signal obtained after the IQ mismatch occurs. In FIG. 10A, peaks of a video carrier signal 201 and a sound carrier signal 202 can be confirmed. In contrast to this, in FIG. 10B, due to the presence of interference spectrum elements 203 and 204 except for the two peaks mentioned above, deterioration in signal quality can be confirmed.

In actual system design, the IQ mismatch is caused by a factor unique to an electronic part or an electronic device which cannot be easily controlled. In order to preferably maintain communication link capability, a circuit (IQ mismatch correction circuit) to correct an IQ mismatch is required to have a sufficient capability to cope with an IQ failure which may be caused by a predetermined design under a desired operation condition.

In general, an IQ mismatch correction circuit used in an actual system can correct predetermined mismatches (phase mismatch and gain mismatch) over a whole communication signal band. In other words, a conventional IQ mismatch correction circuit cannot correct a frequency-dependent phase IQ mismatch. In a receiver related to a multi-carrier communication system, a system having an additional adjustment circuit, or the like, there is disclosed a system which can moderate a frequency-dependent IQ mismatch to some extent. However, since the system requires several assumptions on quality of a transmission signal or requires a large-scale additional circuit which is a factor that increases the complexity of the system and the cost of the system, the system is not sufficiently matched with a general receiver.

The problem of the IQ mismatch correction circuit is known to a person skilled in the art such as designers or the like of receivers. In various applications, several methods and circuits to remove or attenuate an IQ mismatch are devised. However, most of these methods and circuits are based on the assumption that the IQ mismatch is not frequency-dependent. That is, the IQ mismatch is constant over a whole predetermined communication signal band. As a main drawback of the assumption, the corresponding circuit and system cannot correct a frequency-dependent IQ mismatch. Many communication links characterized by devices and parts having IQ mismatch characteristics in which a variation of the IQ mismatch is so large in a communication path band that the IQ mismatch must depend on a frequency can be experimentally observed. In other words, an IQ mismatch correction circuit which can preferably correct a frequency-dependent IQ mismatch is desired. In this case, it must be understood that a frequency-dependent IQ mismatch is general and that an IQ mismatch which is not frequency-dependent is rather special and limited. A correction circuit which can correct a frequency-dependent IQ mismatch can also correct an IQ mismatch which does not depend on a frequency in the same manner.

Conventional IQ mismatch correction techniques and methods are disclosed in U.S. Pat. Nos. 5,157,697, 5,705,949, 6,330,290, 6,898,252, 7,158,586, 7,274,750, 7,298,793, and Koji Maeda et al., "Wideband Image-Rejection Circuit for Low-IF Receivers", ISSCC 2006, 26. 1. For example, U.S. Pat. No. 5,705,949 discloses digital circuit design which can correct an IQ mismatch which is not frequency-dependent without a connection to another part of a receiver. In order to correct a frequency-dependent IQ mismatch, U.S. Pat. No. 6,330,290, U.S. Pat. No. 6,898,252, or Koji Maeda et al., "Wideband Image-Rejection Circuit for Low-IF Receivers", ISSCC 2006, 26. 1 discloses a technique which generates an adjusting signal in an analog circuit of a receiver or on a transmitter side, i.e., a technique which requires an additional circuit besides digital signal processing on a receiver side. The conventional technique disadvantageously requires the additional circuit. In addition, the conventional technique is disadvantageous in that the technique cannot applied to a system in which an analog circuit of a receiver and a digital circuit which corrects an IQ mismatch are separated from each other because, for example, the analog circuit and the digital circuit are supplied from different manufacturers. Furthermore, the conventional technique is disadvantageous in that, when a mismatch condition changes, the technique cannot cope with the conditional change without stopping reception for readjustment. More specifically, even though an adjustment signal is put in an analog circuit, the conventional technique cannot follow the change of the mismatch condition while receiving a predetermined communication signal.

SUMMARY OF THE INVENTION

The present invention has been made in view of the problems of the conventional IQ mismatch correction technique, and an object thereof is to provide an IQ mismatch correction circuit which is a self-contained circuit which does not require an additional circuit except for a circuit for digital signal processing on a receiver side, which can correct a frequency-dependent IQ mismatch independently of other parts of an orthogonal receiver, and which can adjust an IQ mismatch condition while continuously performing a receiving process.

An IQ phase mismatch correction circuit according to the present invention to achieve the above object is an IQ mismatch correction circuit for correcting an IQ mismatch between I-phase and Q-phase digital baseband signals, and the circuit is characterized as a first characteristic feature by comprising: a first digital filter arranged to perform a first or higher order digital filtering process to an I-phase input signal in a time domain; a second digital filter arranged to perform a first or higher order digital filtering process to a Q-phase input signal in the time domain; two or more control circuits arranged to independently generate two or more control variables to derive two or more coefficients of the transfer functions of the first and second digital filters in the time domain, and supply the control variables to the first and second digital filters; and one or more pairs of analyzing filters arranged to change frequency characteristics of an I-phase output signal and a Q-phase output signal so that the frequency characteristics are different from those of the original signals, respectively, the I-phase output signal being a differential signal or a composite signal between a delayed signal of the I-phase input signal and an output signal from the second digital filter, the Q-phase output signal being a differential signal or a composite signal between a delayed signal of the Q-phase input signal and an output signal from the first digital filter, wherein a first control circuit of the two or more control circuits measures a temporally averaged IQ phase mismatch state between the I-phase output signal and the Q-phase output signal, and feeds back the IQ phase mismatch state to the first and second digital filters as a first variable which is one of the two or more control variables, and a second control circuit other than the first control circuit of the two or more control circuits measures a temporally averaged IQ phase mismatch state between output signals on an I-phase side and a Q-phase side of one corresponding pair of analyzing filters of the one or more pairs of analyzing filters, and feeds back the IQ phase mismatch state to the first and second digital filters as a second variable which is another one of the two or more control variables.

An IQ gain mismatch correction circuit according to the present invention to achieve the above object is an IQ gain mismatch correction circuit for correcting an IQ gain mismatch between I-phase and Q-phase digital baseband signals, and the circuit is characterized as a first characteristic feature by comprising: a first digital filter arranged to perform a first or higher order digital filtering process to an I-phase input signal in a time domain; a second digital filter arranged to perform a first or higher order digital filtering process to a Q-phase input signal in the time domain, the second digital filter having a transfer function different from that of the first digital filter; two or more control circuits arranged to independently generate two or more control variables to derive two or more coefficients of the transfer functions of the first and second digital filters in the time domain, and feed back the control variables to the first and second digital filters; and one or more pairs of analyzing filters arranged to change frequency characteristics of an I-phase output signal and a Q-phase output signal so that the frequency characteristics are different from those of the original signals, respectively, the I-phase output signal being an output signal from the first digital filter, the Q-phase output signal being an output signal of the Q-phase input signal, wherein a first control circuit of the two or more control circuits measures a temporally averaged IQ gain mismatch state between the I-phase output signal and the Q-phase output signal, and feeds back the IQ gain mismatch state to the first and second digital filters as a first variable which is one of the two or more control variables, and a second control circuit other than the first control circuit of the two or more control circuits measures a temporally averaged IQ gain mismatch state between output signals on an I-phase side and a Q-phase side of one corresponding pair of analyzing filters of the one or more pairs of analyzing filters, and feeds back the IQ gain mismatch state to the first and second digital filters as a second variable which is another one of the two or more control variables.

Both the IQ phase mismatch correction circuit and the IQ gain mismatch correction circuit having the first characteristic features perform filtering processes to I-phase and Q-phase input signals by using the first and second digital filters, correct an IQ phase mismatch or an IQ gain mismatch between the I-phase and Q-phase input signals to output the resultant signals as I-phase and Q-phase output signals. Furthermore, two or more coefficients for determining transfer functions of the first and second digital filters are determined by a first feedback loop in which the I-phase and Q-phase output signals pass through the first control circuit and a second feedback loop in which the I-phase and Q-phase output signals change their frequency characteristics through the analyzing filters and then pass through the second control circuit. The first and second digital filters are configured by the feedback loops of two systems as adaptive filters, respectively.

Correction of an IQ phase mismatch or an IQ gain mismatch at a certain frequency depends on frequency response characteristics of the first and second digital filters at the frequency. A relation between an amount of correction and the frequency response characteristic is not linear. However, the amount of correction increases as a frequency response increases. In this case, when the first and second digital filters are 0-order digital filters (i.e., perform only gain adjustment), the frequency response characteristic is flat, i.e., there is no dependence on the frequency. However, in the present invention, since two or more coefficients of the transfer functions, i.e., first or higher order digital filters are used, the frequency response changes depending on the frequency. In other words, the first and second digital filters are made adaptive to make it possible to correct a frequency-dependent IQ phase mismatch or a frequency-dependent IQ gain mismatch.

More specifically, in the IQ phase mismatch correction circuit, the corrected I-phase and Q-phase output signals are outputted by making a difference or composition between one of the I-phase and Q-phase input signals and the other that is subjected to a digital filtering process. In addition, since the correction of the IQ phase mismatch is an operation of offsetting signal components of the counterpart mixed in each of the I-phase and Q-phase input signals, even though the frequency characteristics of the first and second digital filters are equal to each other or different from each other, the amount of correction of the IQ phase mismatch depends on the frequency response characteristics of the first and second digital filters. In contrast to this, in the IQ gain mismatch correction circuit, since correction of an IQ gain mismatch is an operation of correcting a difference between amplitudes of the I-phase and Q-phase input signals, a ratio of a frequency response of the first digital filter to a frequency response of the second digital filter must be frequency-dependent, and transfer functions of the first and second digital filters are different from each other.

Furthermore, when the first and second digital filters are configured as adaptive filters, it is important to independently make coefficients of the transfer functions of the first and second digital filters adaptive. In other words, in the IQ phase mismatch correction circuit and the IQ gain mismatch correction circuit, the two or more control circuits of the mismatch circuits perform common processes of measuring temporally averaged IQ mismatch states (IQ phase mismatch state or IQ gain mismatch state) between the I-phase and Q-phase processing object signals to feed back the IQ mismatch states to the first and second digital filters as control variables. For this reason, the I-phase and Q-phase processing object signals to be processed by the control circuits must not be the same signal contents. More specifically, diversity of signals among each pair of processing object signals inputted to the two or more control circuits is required. In the present invention, due to a change in frequency characteristic caused by the analyzing filter realizes the diversity of the processing object signals. As a result, the different IQ mismatch states at two different frequencies can be independently corrected. Consequently, the frequency-dependent IQ phase mismatch and the frequency-dependent IQ gain mismatch are corrected, respectively.

Furthermore, in the IQ phase mismatch correction circuit and the IQ gain mismatch correction circuit having the first characteristic features, since the first and second digital filters, the control circuits, and the analyzing filters process sequentially inputted signals in a time domain, an IQ mismatch correction process can be continuously executed in actual time without interrupting reception of a digital baseband signal, i.e., without interrupting a receiving process or a demodulating process on a receiver side.

Each of the IQ phase mismatch correction circuit and the IQ gain mismatch correction circuit having the first characteristic features is further characterized as a second characteristic feature in that, when the number of control variables is not less than 3 and the number of pairs of the analyzing filters is not less than 2, transfer functions of one pair of the analyzing filters and another pair of the analyzing filters are different from each other.

In the IQ phase mismatch correction circuit and the IQ gain mismatch correction circuit having the second characteristic feature, since the number of control variables is not less than 3, a higher-order adaptive filter can be realized, and a frequency dependent IQ mismatch correction process can be executed with high performance. However, as described above, since three or more control variables must be independently derived, diversity of each pair of processing object signals inputted to the same number of control circuits as the number of control variables must be secured. When the number of analyzing filters is two or more, the diversity of the signals between all the pairs of processing object signals can be reliably realized by differentiating transfer function of one pair of analyzing filters from that of the other pair of analyzing filters, so that a frequency-dependent IQ mismatch correction process can be more accurately executed.

The IQ phase mismatch correction circuit having the first or second characteristic feature is further characterized as a third characteristic feature in that each of the two or more control circuits performs a multiplying process to I-phase and Q-phase processing object signals in the time domain, and sequentially executes adapting processes for the control variables by a least mean square algorithm by using the result of the multiplying process. The IQ gain mismatch correction circuit having the first or second characteristic feature is further characterized as a third characteristic feature in that each of the two or more control circuits performs a subtracting process and an adding process to I-phase and Q-phase processing object signals in the time domain and a multiplying process to the results of the subtracting process and the adding process, and sequentially executes adapting processes to the control variables by the least mean square algorithm by using the result of the multiplying process.

In the IQ phase mismatch correction circuit having the third characteristic feature, since processing object signals inputted to the control circuits originally have orthogonality, by using multiplying process results (expressing IQ phase mismatch states at individual processing times) to each pair of processing object signals, a temporally averaged IQ phase mismatch state between the pair of processing object signals is measured to make it possible to sequentially execute the adapting processes of the control variables by the least mean square algorithm. In the I-phase and Q-phase output signals, when the IQ phase mismatch is completely corrected, a temporal average of products of both the output signals is 0. On the other hand, in the IQ gain mismatch correction circuit having the third characteristic feature, since the processing object signals inputted to the control circuits are originally normalized, an averaged IQ gain mismatch state between each pair of processing object signals is measured by using a multiplying process result to a subtracting process result and a addition result to each pair of processing object signals (expressing IQ gain mismatch states at individual processing times) to sequentially execute adapting processes for the control variables by the least mean square algorithm. In the I-phase and Q-phase output signals, when the IQ gain mismatch is completely corrected, a temporal average of a product (difference between squares, i.e., an electric power difference) between a difference and a sum of both the output signals is zero. Furthermore, an algorithm except for a least mean square (LMS) algorithm (for example, recursive least square (RLS) algorithm, a PID (Proportional Integral Derivative) algorithm, a maximum likelihood (ML) algorithm, and the like) can be used as an adapting algorithm of the control variables. However, the least mean square algorithm has the advantage of being considerably tougher and stabler than the other algorithms and being able to be realized by a small-scale circuit configuration.

The IQ phase mismatch correction circuit and the IQ gain mismatch correction circuit having any one of the above characteristic features are further characterized as a fourth characteristic feature in that each of the first and second digital filters is a finite impulse response filter having a second or higher order symmetric structure.

According to the IQ phase mismatch correction circuit and the IQ gain mismatch correction circuit having the fourth characteristic feature, first and second digital filters of high-orders can be realized by a small number of control variables, i.e., a smaller circuit scale, and a frequency-dependent IQ mismatch can be accurately corrected. The first and second digital filters can be configured by infinite impulse response filters. However, the first and second digital filters are preferably configured by finite impulse response filters because the first and second digital filters configured by the infinite impulse response filters have the following disadvantages.

Since the infinite impulse response filter does not have preferable group delay characteristics, the group delay characteristics need to be corrected later. However, since the first and second digital filters are configured as adaptive filters, the correction circuit also needs to be configured as an adaptive filter, and the circuit configuration becomes complex. In the infinite impulse response filter, since a response to a control variable is disordered more than a finite impulse response filter, an infinite impulse response filter having practical stability, convergence, and good response cannot easily designed. Furthermore, since the infinite impulse response filter has a feedback delay therein, a continuous adaptive filtering process cannot be easily performed in actual time. For this reason, each time a coefficient of a feedback term of a transfer function is updated, a memory in a filter needs to be reset, and noise caused by resetting the memory increases. In this manner, in order to continuously update the transfer functions of the first and second digital filters, the infinite impulse response filter is not preferable.

The IQ phase mismatch correction circuit and the IQ gain mismatch correction circuit having any one of the above characteristic features are further characterized as a fifth characteristic feature in that the analyzing filters are infinite impulse response filters.

According to the IQ phase mismatch correction circuit and the IQ gain mismatch correction circuit having the fifth characteristic feature, the analyzing filters are configured by infinite impulse response filters to miniaturize the circuit and to reduce a power consumption. The analyzing filter is not present on a data transmission path of the IQ phase mismatch correction circuit and the IQ gain mismatch correction circuit, i.e., outputs from the analyzing filters are not outputted to the outside, and furthermore, the analyzing filters are not adaptive, and transfer functions are completely fixed. For this reason, problems occurring when the infinite impulse response filters are applied to the first and second digital filters are not applicable to the analyzing filters.

An IQ mismatch correction circuit according to the present invention to achieve the above object is characterized as a first characteristic feature by comprising: the IQ phase mismatch correction circuit; and the IQ gain mismatch correction circuit having any one of the above characteristic features, wherein the IQ phase mismatch correction circuit and the IQ gain mismatch correction circuit are connected in a row such that one of the IQ phase mismatch correction circuit and the IQ gain mismatch correction circuit is at an upstream stage as an upstream circuit and the other is at a downstream stage as a downstream circuit, I-phase and Q-phase digital baseband signals are inputted as I-phase and Q-phase input signals of the upstream circuit, and I-phase and Q-phase output signals of the upstream circuit are inputted as I-phase and Q-phase input signals of the downstream circuit, and I-phase and Q-phase output signals of the downstream circuit are outputted as I-phase and Q-phase digital baseband signals after IQ mismatch correction.

According to the IQ mismatch correction circuit having the first characteristic feature, since the IQ mismatch correction circuit includes the IQ phase mismatch correction circuit and the IQ gain mismatch correction circuit, both of a frequency-dependent IQ phase mismatch and a frequency-dependent IQ gain mismatch can be continuously corrected in actual time.

The IQ mismatch correction circuit having the first characteristic feature is further characterized as a second characteristic feature in that the one or more pairs of analyzing filters of the downstream circuit are commonly used as the one or more pairs of analyzing filters of the upstream circuit.

According to the IQ mismatch correction circuit having the second characteristic feature, since an analyzing filter in any one of the IQ phase mismatch correction circuit and the IQ gain mismatch correction circuit arranged in the upstream stage can be omitted, a circuit scale can be reduced, and a power consumption can be reduced.

A receiving apparatus according to the present invention comprises, in a downstream stage of an orthogonal receiver, the IQ phase mismatch correction circuit having any one of the above characteristic features, the IQ gain mismatch correction circuit having any one of the above characteristic features, or the IQ mismatch correction circuit having any one of the above characteristic features.

According to the receiving apparatus having the above characteristic feature, since the receiving apparatus includes the IQ phase mismatch correction circuit having any one of the above characteristic features, the IQ gain mismatch correction circuit having any one of the above characteristic features, or the IQ mismatch correction circuit having any one of the above characteristic features, with respect to I-phase and Q-phase digital baseband signals outputted from the orthogonal receiver, at least one of frequency-dependent IQ phase mismatch and a frequency-dependent IQ gain mismatch can be continuously corrected in actual time.

DETAILED DESCRIPTION OF THE INVENTION

Embodiments of an IQ phase mismatch correction circuit and an IQ gain mismatch correction circuit according to the present invention and an IQ mismatch correction circuit and a receiving apparatus which include the IQ phase mismatch correction circuit and the IQ gain mismatch correction circuit will be described below with reference to the accompanying drawings.

Embodiment of IQ Mismatch Correction Circuit

Figure 1:
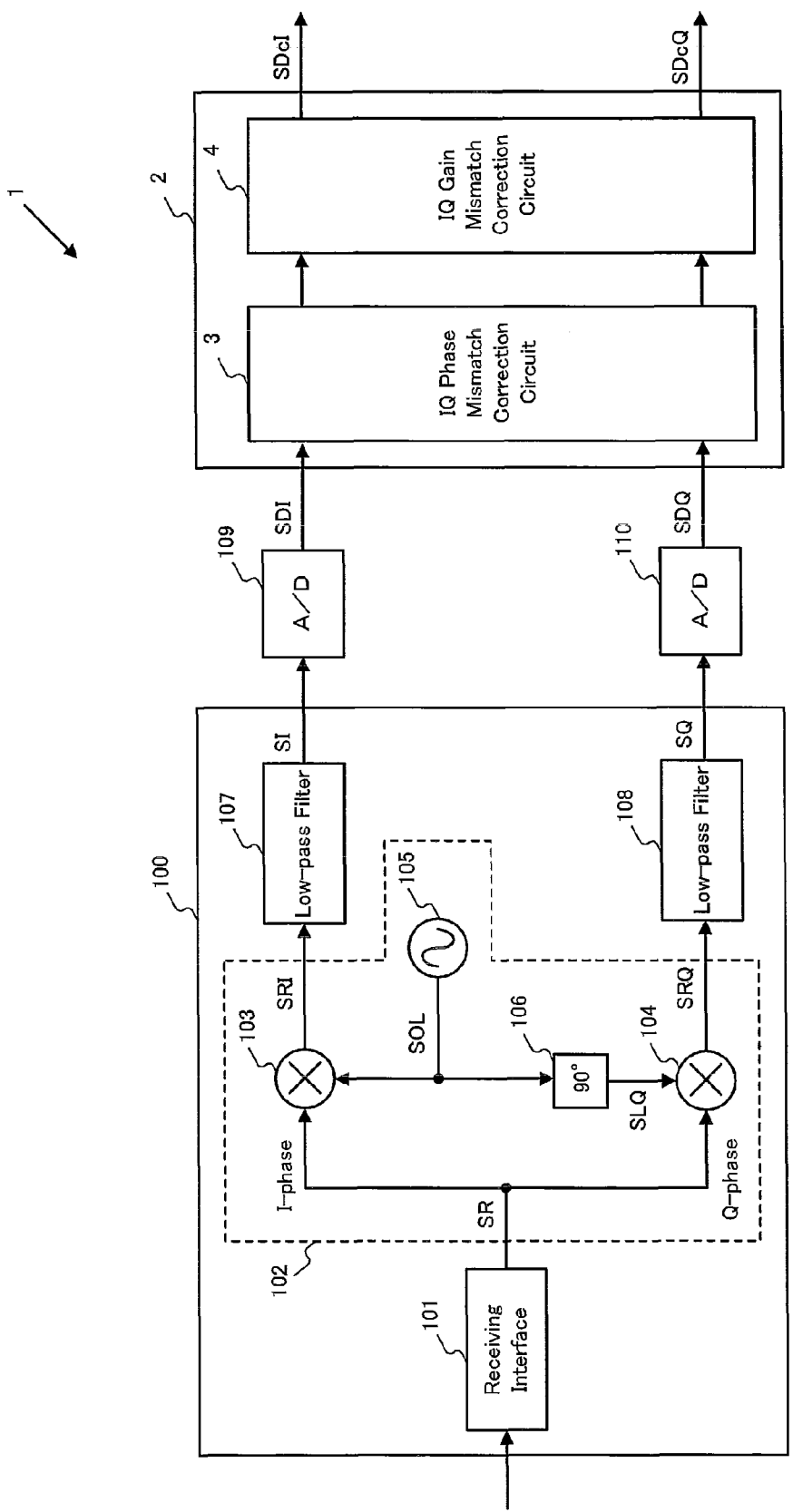
FIG. 1 is a block diagram showing a schematic configuration of one embodiment of an IQ mismatch correction circuit according to the present invention and a receiving apparatus using the same.

In the present embodiment, an IQ mismatch correction circuit 2, as shown in FIG. 1, is configured such that, with respect to I-phase and Q-phase digital baseband signals SDI and SDQ outputted from A/D converters 109 and 110 arranged in a downstream stage of an orthogonal receiver 100, a frequency-dependent IQ mismatch between both the signals is corrected. An IQ phase mismatch correction circuit 3 which corrects an IQ phase mismatch and an IQ gain mismatch correction circuit 4 which corrects an IQ gain mismatch are connected in a row such that one of the correction circuits is connected to the other. The IQ phase mismatch correction circuit 3 and the IQ gain mismatch correction circuit 4 share several properties, and circuit configurations and the like will be described later. In FIG. 1, the IQ phase mismatch correction circuit 3 is arranged in the upstream stage, and the IQ gain mismatch correction circuit 4 is arranged in the downstream stage. However, the arrangements are only examples, and the arrangement positions may be reversed. The reversed arrangement positions do not damage the concept, effects, performance, and the like of the present invention. A receiving apparatus 1 has a configuration in which the IQ mismatch correction circuit 2 is arranged in the downstream stage of the orthogonal receiver 100. I-phase and Q-phase digital baseband signals SDcI and SDcQ corrected by the IQ mismatch correction circuit 2 are processed by a demodulating circuit (not shown) arranged in the downstream stage of the IQ mismatch correction circuit 2.

Figure 9:
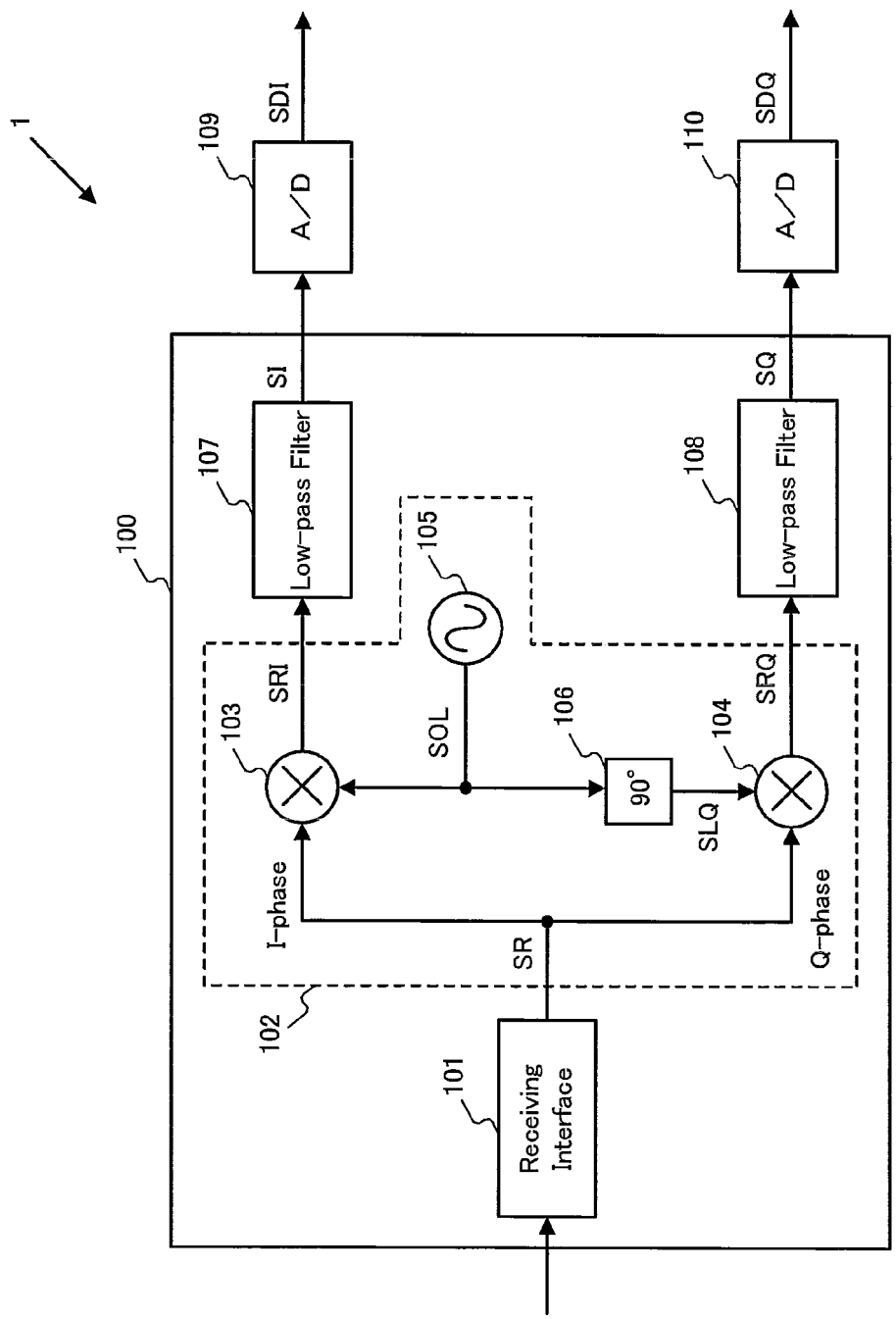
FIG. 9 is a circuit diagram showing a general circuit configuration of an orthogonal receiver.
Figure 10A:
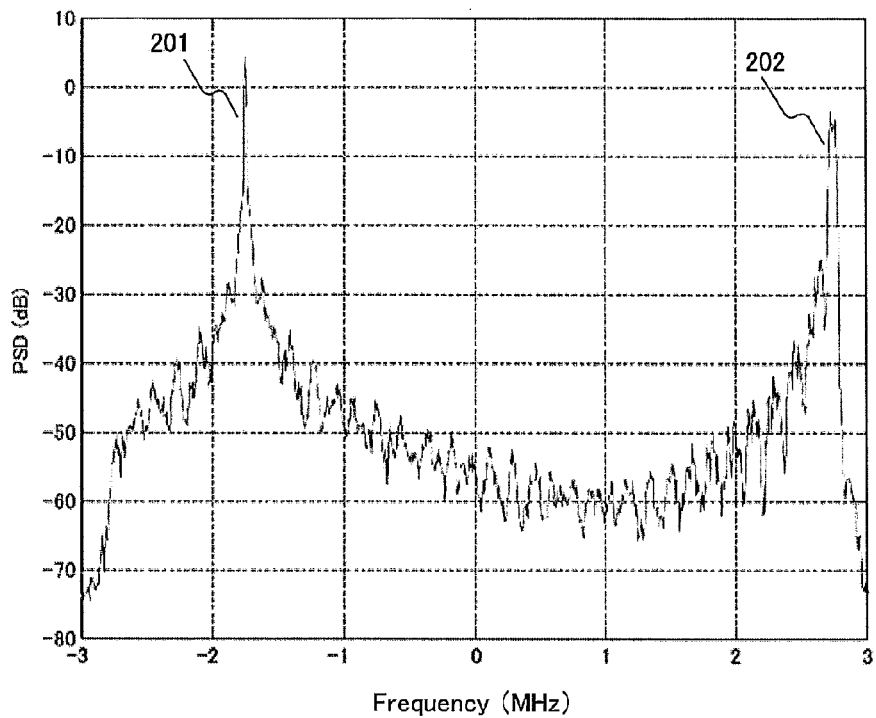
FIGS. 10A and 10B are views each showing an example of quality deterioration of a reception signal caused by an IQ mismatch.
Figure 10B:
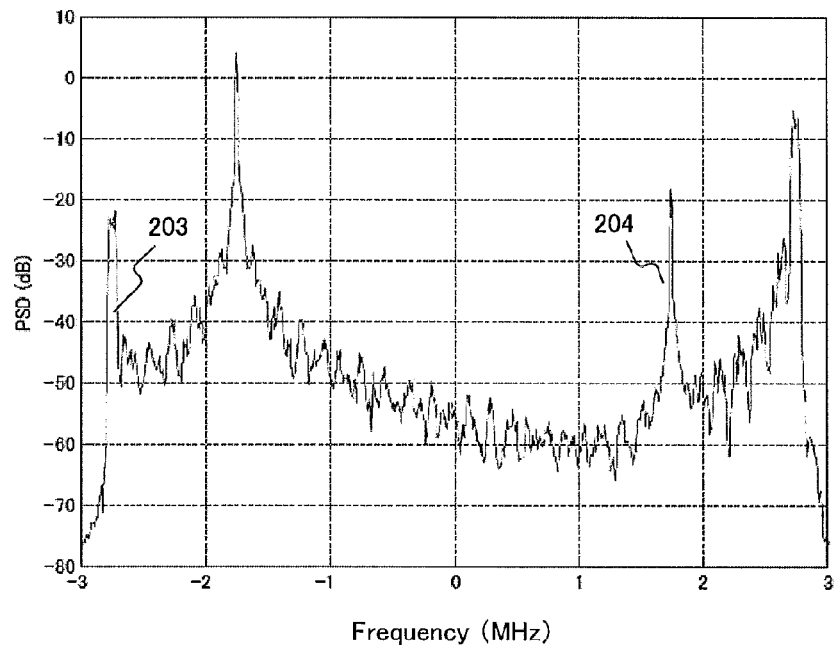

The orthogonal receiver 100 has the same configuration as that of the orthogonal receiver shown in FIG. 9 and includes an receiving interface 101 to receive a transmission signal transmitted from a transmitter side through a wireless or wireline communication channel. The receiving interface 101 includes electronic parts such as a filter, an amplifier, a mixer, and an antenna regulated by the orthogonal receiver 100. However, since a known circuit configuration can be used, a detailed description will not be given. In the downstream stage of the receiving interface 101, a separation circuit 102 to separate a reception signal SR outputted from the receiving interface 101 into two orthogonal I-phase reception signal SRI and a Q-phase reception signal SRQ is arranged. The separation circuit 102 includes two mixers 103 and 104, a local oscillator 105, and a phase shifter 106 which shifts a phase of an oscillation signal SOL from the local oscillator by 90 degrees. The reception signal SR is separated into two systems on the I-phase side and the Q-phase side. The mixer 103 multiplies the reception signal SR on the I-phase side by the oscillation signal SOL from the local oscillator 105 to generate an I-phase reception signal SRI. The mixer 104 multiplies the reception signal SR on the Q-phase side by an oscillation signal SLQ from the phase shifter 106 to generate a Q-phase reception signal SRQ. An I-phase baseband signal SI and a Q-phase baseband signal SQ outputted from low-pass filters 107 and 108 are digitized by the A/D converters 109 and 110, respectively to generate I-phase and Q-phase digital baseband signals SDI and SDQ, and the I-phase and Q-phase digital baseband signals SDI and SDQ are inputted to the IQ mismatch correction circuit 2. In this case, the digital baseband signals SDI and SDQ are complex digital baseband signals. The signal SDI serves as a real component, and the signal SDQ serves as an imaginary component.

As described above, in an ideal communication link, theoretically, the digital baseband signals SDI and SDQ have complete orthonormality, and are in such a state that the digital baseband signals SDI and SDQ can be directly processed by a demodulation circuit suitable for a predetermined communication link. However, in an actual circuit, due to incompleteness of various electronic parts and electronic devices being present on transmission paths, a certain extent of phase distortion occurs in distortion of another type. As a result, signal powers of the digital baseband signals SDI and SDQ are different from each other. Since the quality of the reception signal is deteriorated because of this phenomenon, before demodulating processes for the digital baseband signals SDI and SDQ are performed, the IQ mismatch correction circuit 2 executes the IQ mismatch correction process to the digital baseband signals SDI and SDQ. In the present embodiment, the digital baseband signals SDI and SDQ to be processed are discrete time-series data sampled at predetermined intervals. The circuits which configure the IQ phase mismatch correction circuit 3 and the IQ gain mismatch correction circuit 4 are configured to process the time-series data in a time domain. In the following description, an expression (for example, [n], [n+1], or the like) representing discrete time (i.e., time-series order) is added to a signal name as necessary.

Embodiment of IQ Phase Mismatch Correction Circuit

Figure 2:
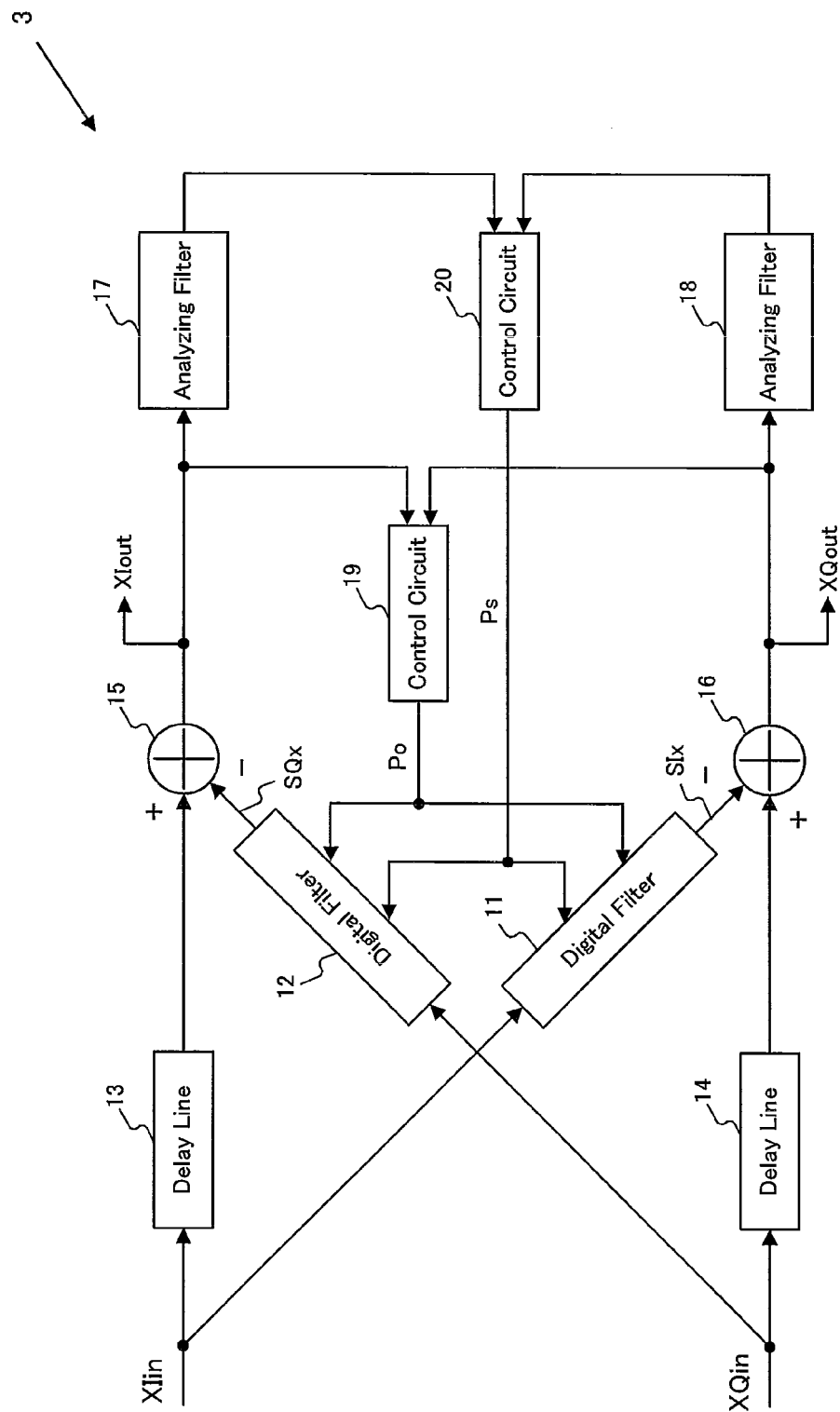
FIG. 2 is a block diagram showing a schematic configuration of one embodiment of an IQ phase mismatch correction circuit according to the present invention.

FIG. 2 shows a preferred embodiment of the IQ phase mismatch correction circuit 3. In the present embodiment, the IQ phase mismatch correction circuit 3 includes one pair of digital filters 11 and 12, one pair of delay lines 13 and 14, one pair of subtractors 15 and 16, one pair of analyzing filters 17 and 18, and control circuits 19 and 20 which execute two LMS (Least Mean Square) algorithms. In order to correct an IQ phase mismatch (phase error) between the two input signals XIin and XQin, the IQ phase mismatch correction circuit 3 generates two crossover signals SIx and SQx which are filtered by the digital filters 11 and 12 in which the orders of input signals XIin and XQin are 1 or more. A crossover signal SQx is subtracted from the input signal XIin passing through the delay line 13 by the subtractor 15 to generate an output signal XIout, and the crossover signal SIx is subtracted from the input signal XQin passing through the delay line 14 by the subtractor 16 to generate an output signal XQout. With the filtering processes and the subtracting processes of the two systems, the orthogonality between the two input signals XIin and XQin is improved. Ideally, when a 90-degrees phase relation is reconstructed, an IQ phase mismatch between both the input signals is eliminated or considerably attenuated. The pair of delay lines 13 and 14 is independently shown in the figure for the convenience of description. However, the delay lines 13 and 14 are integrated with the digital filters 11 and 12, respectively, to reduce the circuit scale. The subtracting processes performed by the subtractors 15 and 16 can be replaced with adding processes performed by adders when the signs of the output signals SIx and SQx from the digital filters 11 and 12 are inverted between positive and negative.

In FIG. 2, in the configuration in which the IQ phase mismatch correction circuit 3 is arranged in the upstream stage and the IQ gain mismatch correction circuit 4 arranged in the downstream stage shown in FIG. 1, the input signals XIin and XQin are the digital baseband signals SDI and SDQ. When the IQ phase mismatch correction circuit 3 is arranged in the downstream stage of the IQ gain mismatch correction circuit 4, the input signals XIin and XQin are I-phase and Q-phase output signals from the IQ gain mismatch correction circuit 4.

The digital filters 11 and 12 must be adjusted to reflect signal conditions and circuit conditions to adaptively correct a frequency-dependent IQ phase mismatch between the two input signals XIin and XQin. For this purpose, the IQ phase mismatch correction circuit 3 includes a special measuring circuit which provides control variables to the digital filters 11 and 12. In the present embodiment, the digital filters 11 and 12 are configured as second-order filters using two control variables Po and Ps. When the digital filters 11 and 12 are configured by higher-order filters, the number of control variables merely increases, and this configuration does not depart from the spirit and scope of the present invention described below. In the preferred example shown in FIG. 2, in order to briefly describe the concept of the present invention, a simple configuration is illustrated. The description will be made on the assumption that the digital filters 11 and 12 are second-order filters. However, the description can be easily extended to higher-order filters.

In order to adjust the digital filters 11 and 12 and to promptly follow a change in IQ mismatch condition, two or more control variables are required. In the embodiment, to secure preferable stability and system performance, a feedback plan based on an LMS algorithm is employed. The first control circuit 19 generates the first control variable Po from the output signals XIout and XQout, and the second control circuit 20 generates the second control variable Ps from the output signals from the analyzing filters 17 and 18. In this case, in order to generate the second control variable Ps independently of the first control variable Po, signal diversity between signals processed by the two control circuits 19 and 20 is required. For example, in Koji Meda et al., "WideBand Image-Rejection Circuit for Low-IF Receivers", ISSCC 2006, 26. 1, the signal diversity is realized by using, for example, various adjusting signals having different frequencies. In the present embodiment, the signal diversity is realized by the two analyzing filters 17 and 18. The analyzing filters 17 and 18 perform modulation to the frequency characteristics of the output signals XIout and XQout to make the frequency characteristics different from original frequency characteristics, respectively, to make the second control circuit 20 possible to generate the second control variable Ps. In the system using high-order digital filters as the digital filters 11 and 12, the analyzing filters are added so that additional control variables can be generated.

Two concrete examples obtained when the first and second control variables Po and Ps are used as coefficients of the transfer functions of the digital filters 11 and 12 are expressed by the following equations 1 and 2. Each of the transfer functions expressed by the equations 1 and 2 configures a finite impulse response (FIR) filter having 0-order and 2-order coefficients which are equal to each other and a symmetric structure. Therefore, the transfer functions expressed by the equations 1 and 2 are regulated only by the two control variables Po and Ps. Various transfer functions except for the transfer functions having the symmetrical structure expressed by the equations 1 and 2 can be used. It is apparent to a person skilled in the art that the same operational effects can be achieved without departing from the basic principle of the present invention.

$$H(z) = Po \times z^{-1} + Ps \times (1 + z^{-2}) \tag{1}$$

$$H(z) = (Po + 2 \times Ps) \times z^{-1} + Ps \times (1 + z^{-2}) \tag{2}$$

In the above description, it is assumed that the digital filters 11 and 12 have equal transfer functions. However, the transfer functions of the digital filters 11 and 12 may not always be equal to each other.

In the present embodiment, since the IQ mismatch correction circuit 3 has a feedback structure realized by the control circuits 19 and 20, a change in IQ mismatch condition with time is followed by the control circuits 19 and 20. This change is supplied to the input signals XIin and XQin so as to continuously generate the output signals XIout and XQout.

Figure 3:
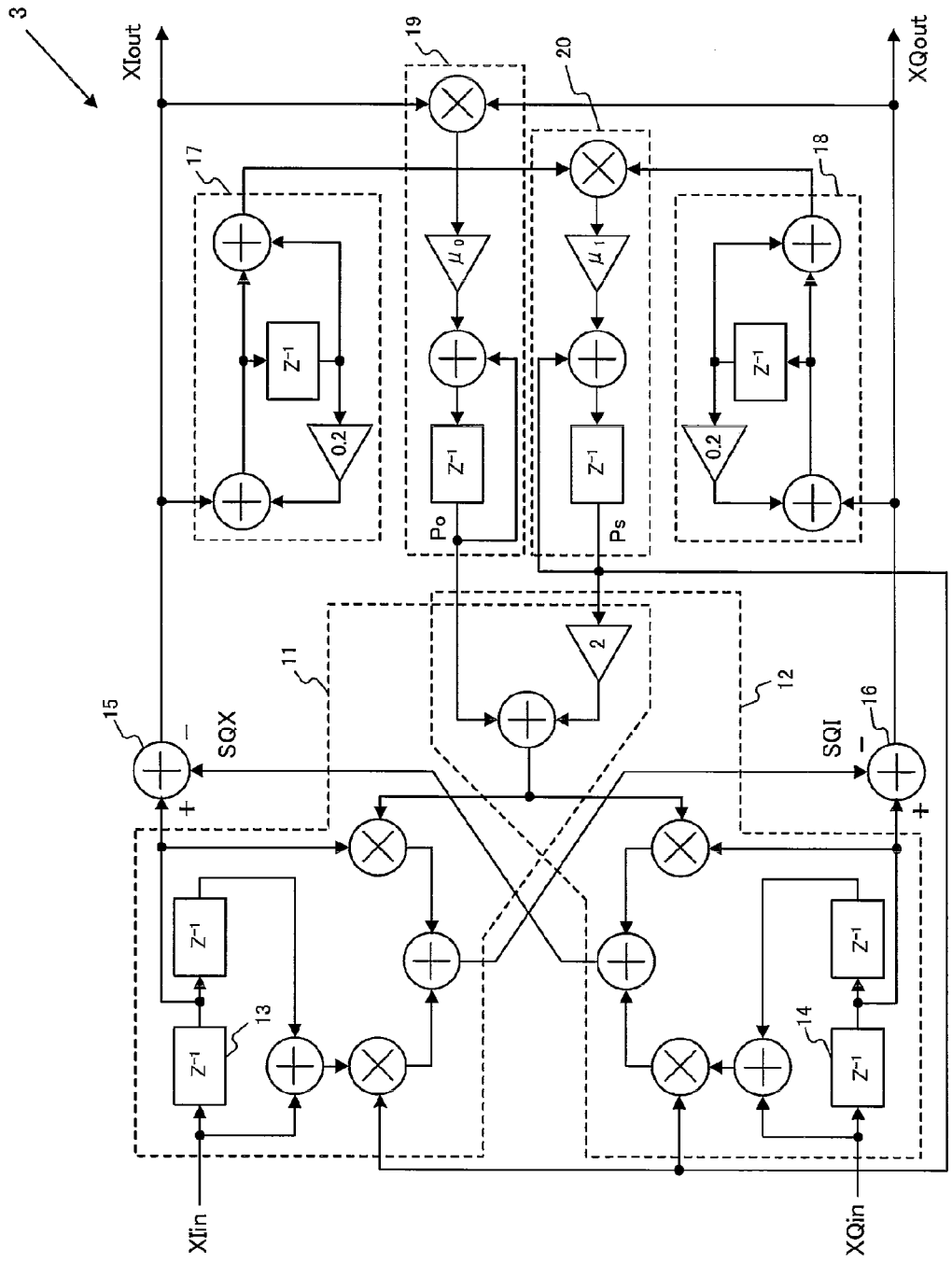
FIG. 3 is a circuit diagram showing a detailed circuit configuration of one embodiment of the IQ phase mismatch correction circuit according to the present invention.

FIG. 3 shows a more detailed circuit configuration of the IQ phase mismatch correction circuit 3. In the example shown in FIG. 3, the transfer functions of the digital filters 11 and 12 are transfer functions expressed by the equation 2. The delay lines 13 and 14 are configured by using delay elements ($z^{-1}$) in the digital filters 11 and 12, respectively. The first control circuit 19 multiplies a signal obtained by multiplying the output signals XIout and XQout by a step size parameter μ0. After a control variable Po [n] processed before one sampling period is added to the multiplication result, the resultant signal passes through the delay element ($z^{-1}$) to generate a control variable Po [n+1]. Similarly, the second control circuit 20 multiplies a signal obtained by multiplying the output signals XIm and XQm on the I-phase side and the Q-phase side of the analyzing filters 17 and 18 by a step size parameter μ1. After a control variable Ps [n] processed before one sampling period is added to the multiplication result, the resultant signal passes through the delay element ($z^{-1}$) to generate a control variable Ps [n+1]. Processes performed by the LMS algorithm of the control circuits 19 and 20 shown in FIG. 3 are expressed by the following equations 3 and 4.

$$Po[n+1] = Po[n] + \mu 0 \times (XIout[n] \times XQout[n]) \tag{3}$$

$$Ps[n+1] = Ps[n] + \mu 1 \times (XIm[n] \times XQm[n]) \tag{4}$$

In the example shown in FIG. 3, the analyzing filters 17 and 18 are configured by infinite impulse response (IIR) filters which are recursive filters having completely the same circuit configurations and having feedback loops therein. Transfer functions Ha(z) of the filter is expressed by the following equation 5. The analyzing filters 17 and 18 change frequency characteristics to amplify a specific frequency domain of an original signal and attenuate the other frequency domain. The analyzing filters 17 and 18 configured by the IIR filter can realize miniaturization of the circuit and a reduction in power consumption and can obtain smooth attenuation characteristics. For this reason, the analyzing filters 17 and 18 can modulate signal power at various frequencies, and any frequency components in the frequency band of the original signal are not completely removed. In other words, this means that signal information is not lacking due to generation of signal diversity.

$$Ha(z) = (1 + z^{-1})/(1 - 0.2 \times z^{-1}) \tag{5}$$

As described above, since the control circuits 19 and 20 operate in a time domain, the control variables Po and Ps do not require pieces of information of frequency characteristics of the processing object signals, and temporal averages of IQ phase mismatch states (results of the multiplying processes) of each pair of processing object signals are obtained. Since the analyzing filters 17 and 18 also operate in a time domain, averaging operations by different weighting coefficients are consequently performed to the control variables Po and Ps, respectively.

In the example shown in FIG. 3, with the above circuit configuration, IQ phase mismatches between the output signals XIout and XQout are sequentially corrected in a time domain with respect to the input signals XIin and XQin as expressed by the following equations 6 and 7. The second terms of the right-hand sides of the equations 6 and 7 are correction terms of the IQ phase mismatches.

$$XIout[n] = XIin[n-1] - \begin{pmatrix} (Po[n] + 2 \times Ps[n]) \times XQin[n-1] + \\ Ps[n](XQin[n] + XQin[n-2]) \end{pmatrix} \quad (6)$$

$$XQout[n] = XQin[n-1] - \begin{pmatrix} (Po[n] + 2 \times Ps[n]) \times XIin[n-1] + \\ Ps[n](XIin[n] + XIin[n-2]) \end{pmatrix} \quad (7)$$

In the present embodiment, the orders of the digital filters 11 and 12 are 2. However, the orders can be arbitrarily changed depending on a request for a type of an IQ mismatch that a communication link is expected to sustain and performance of an IQ mismatch correction circuit.

Figure 4:
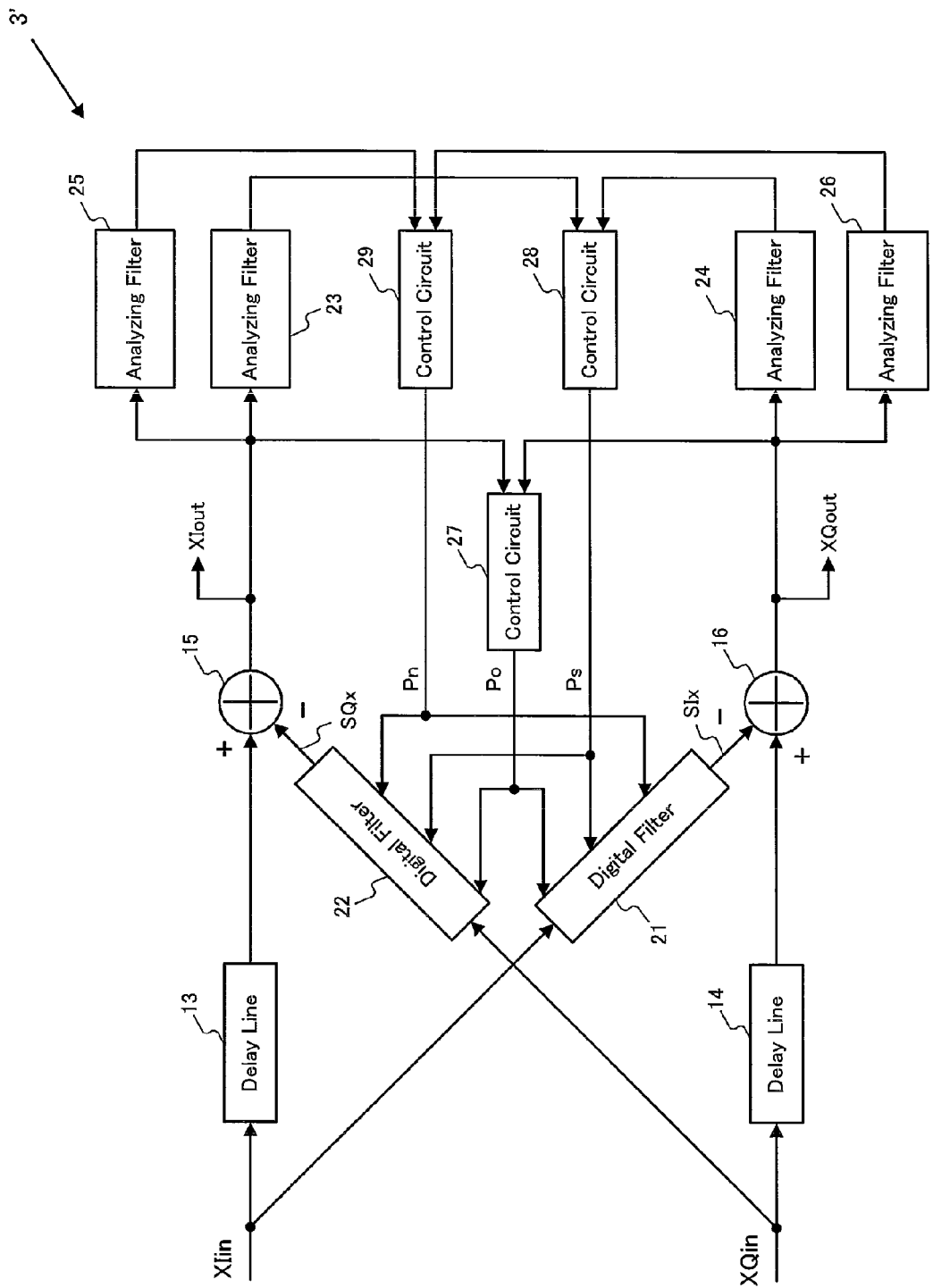
FIG. 4 is a block diagram showing a schematic configuration of another embodiment of the IQ phase mismatch correction circuit according to the present invention.

FIG. 4 shows another example of the IQ phase mismatch correction circuit 3 shown in FIG. 2. An IQ phase mismatch correction circuit 3' shown in FIG. 4 includes one pair of digital filters 21 and 22, one pair of delay lines 13 and 14, one pair of subtractors 15 and 16, two pairs of analyzing filters 23 to 26, and three control circuits 27 to 29 which execute the LMS algorithm. The digital filters 21 and 22 have orders which are higher than those of the digital filters 11 and 12 of the IQ phase mismatch correction circuit 3 shown in FIG. 2, and are configured as fourth-order filters using three control variables Po, Ps, and Pn. In comparison with the IQ phase mismatch correction circuit 3 shown in FIG. 2, in order to generate an additional control variable Pn, one pair of analyzing filters 25 and 26 and one control circuit 29 are added.

A concrete example in which the first to third control variables Po, Ps, and Pn are used as coefficients of transfer functions of the digital filters 21 and 22 is expressed by the following equation 8.

$$H(z) = (Po + 2 \times Ps + 2 \times Pn) \times z^{-2} + Ps \times (z^{-1} + z^{-3}) + Pn \times (1 + z^{-4}) \quad (8)$$

An object of the analyzing filters 17, 18, and 23 to 26 is to realize signal diversity to each pair of processing object signals inputted to the three control circuits 27 to 29. Therefore, as long as the signal diversity can be realized, design freedom to an architecture of an analyzing filter is extremely high. Furthermore, configurations of the analyzing filters may vary while executing essentially the same task and generating the same result. For example, one pair of analyzing filters 23 and 24 and the other pair of analyzing filters 25 and 26 are alternately arranged in parallel with each other. However, the pair of analyzing filters 23 and 24 and the pair of analyzing filters 25 and 26 may be arranged in a row without changing basic operations and circuit performances of the analyzing filters such that, instead of the output signals XIout and XQout, each output from the pair of analyzing filters 25 and 26 is inputted into each of the pair of analyzing filters 23 and 24.

Embodiment of IQ Gain Mismatch Correction Circuit

Figure 5:
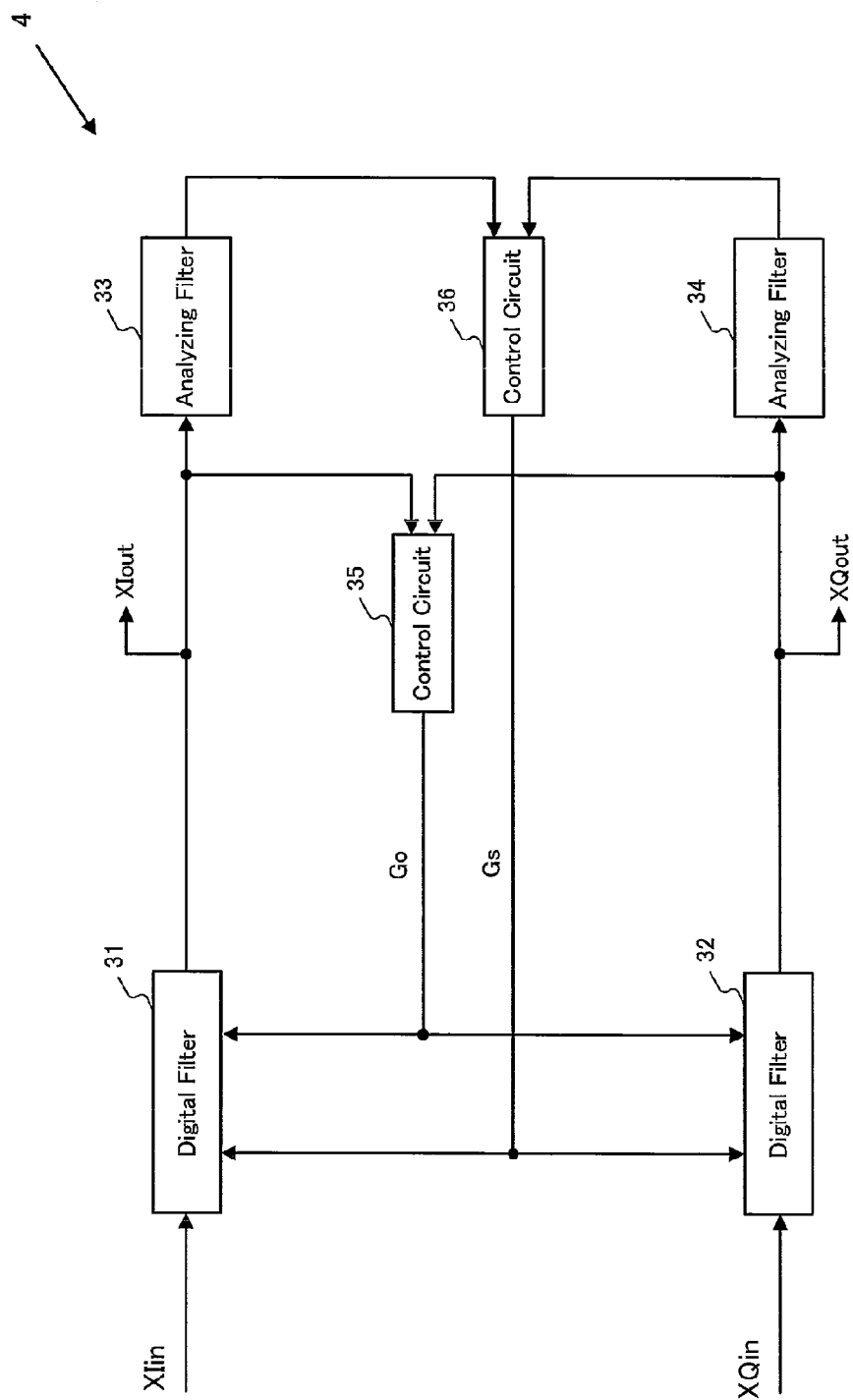
FIG. 5 is a block diagram showing a schematic configuration of one embodiment of an IQ gain mismatch correction circuit according to the present invention.

FIG. 5 shows a preferred example of the IQ gain mismatch correction circuit 4. In the present embodiment, the IQ gain mismatch correction circuit 4 includes one pair of digital filters 31 and 32, one pair of analyzing filters 33 and 34, and two control circuits 35 and 36 which execute the LMS algorithm. The digital filters 31 and 32 perform a process of correcting an IQ gain mismatch (amplitude error) between both the input signals XIin and XQin to generate output signals XIout and XQout. The input signals XIin and XQin are I-phase and Q-phase output signals of the IQ phase mismatch correction circuit 3 in a configuration in which the IQ phase mismatch correction circuit 3 and the IQ gain mismatch correction circuit 4 are arranged in an upstream stage and a downstream stage, respectively. In a configuration in which the IQ phase mismatch correction circuit 3 is arranged in the downstream stage of the IQ gain mismatch correction circuit 4, the input signals XIin and XQin are digital baseband signals SDI and SDQ, respectively.

The digital filters 31 and 32 must be adjusted to reflect signal conditions and circuit conditions in order to adaptively correct a frequency-dependent IQ gain mismatch between the two input signals XIin and XQin. For this purpose, the IQ gain mismatch correction circuit 4 includes a special measuring circuit which supplies control variables to the digital filters 31 and 32. In the present embodiment, the digital filters 31 and 32 are configured as second-order filters using two control variables Go and Gs, and controlled by the two control variables Go and Gs. The first control circuit 35 generates the first control variable Go from the output signals XIout and XQout, and the second control circuit 36 generates the second control variable Gs from output signals from the analyzing filters 33 and 34. Signal diversity is realized by using the analyzing filters 33 and 34 which modulate the frequency characteristics of the output signals XIout and XQout used to generate the control variable Gs.

Two concrete examples in which the first and second control variables Go and Gs are used as coefficients of transfer functions of the digital filters 31 and 32 are expressed by the following equations 9 and 10. In the equations 9 and 10, Hi(z) denotes a transfer function of the I-phase digital filter 31, and Hq(z) denotes a transfer function of the Q-phase digital filter 32. When the frequency response characteristics of the digital filters 31 and 32 are equal to each other, a ratio of the frequency response characteristics does not depend on frequencies but is constant. For this reason, a frequency-dependent IQ gain mismatch is not appropriately corrected. Therefore, in the present embodiment, the transfer functions of the digital filters 31 and 32 are set to be different from each other in the I-phase and the Q-phase. More specifically, in order to simplify the circuit design, the signs of the control variables Go and Gs are inverted between positive and negative in the transfer functions. Each of the transfer functions expressed by the equations 7 and 8 configures a finite impulse response (FIR) filter having 0-order and 2-order coefficients which are equal to each other and a symmetric structure. Therefore, the transfer functions expressed by the equations 9 and 10 are regulated by only the two control variables Go and Gs. Various transfer functions except for the transfer functions expressed by the equations 9 and 10 can be used. It is apparent to a person skilled in the art that the same operational advantages can be achieved without departing from the basic principle of the present invention.

$$Hi(z) = (1-Go) \times z^{-1} - (1-Go) \times Gs \times (1+z^{-2})$$

$$Hq(z) = (1+Go) \times z^{-1} - (1+Go) \times Gs \times (1+z^{-2}) \quad (9)$$

$$Hi(z)=(1-Go-2\times Gs)\times z^{-1}-Gs\times(1+z^{-2})$$

$$Hq(z)=(1+Go+2\times Gs)\times z^{-1}+Gs\times(1+z^{-2}) \quad (10)$$

Similar to the IQ phase mismatch correction circuit 3, since the IQ gain mismatch correction circuit 4 has a feedback structure realized by the control circuits 35 and 36, the IQ gain mismatch correction circuit 4 can follow a change in IQ mismatch condition with time while continuously generating the output signals XIout and XQout.

Figure 6:
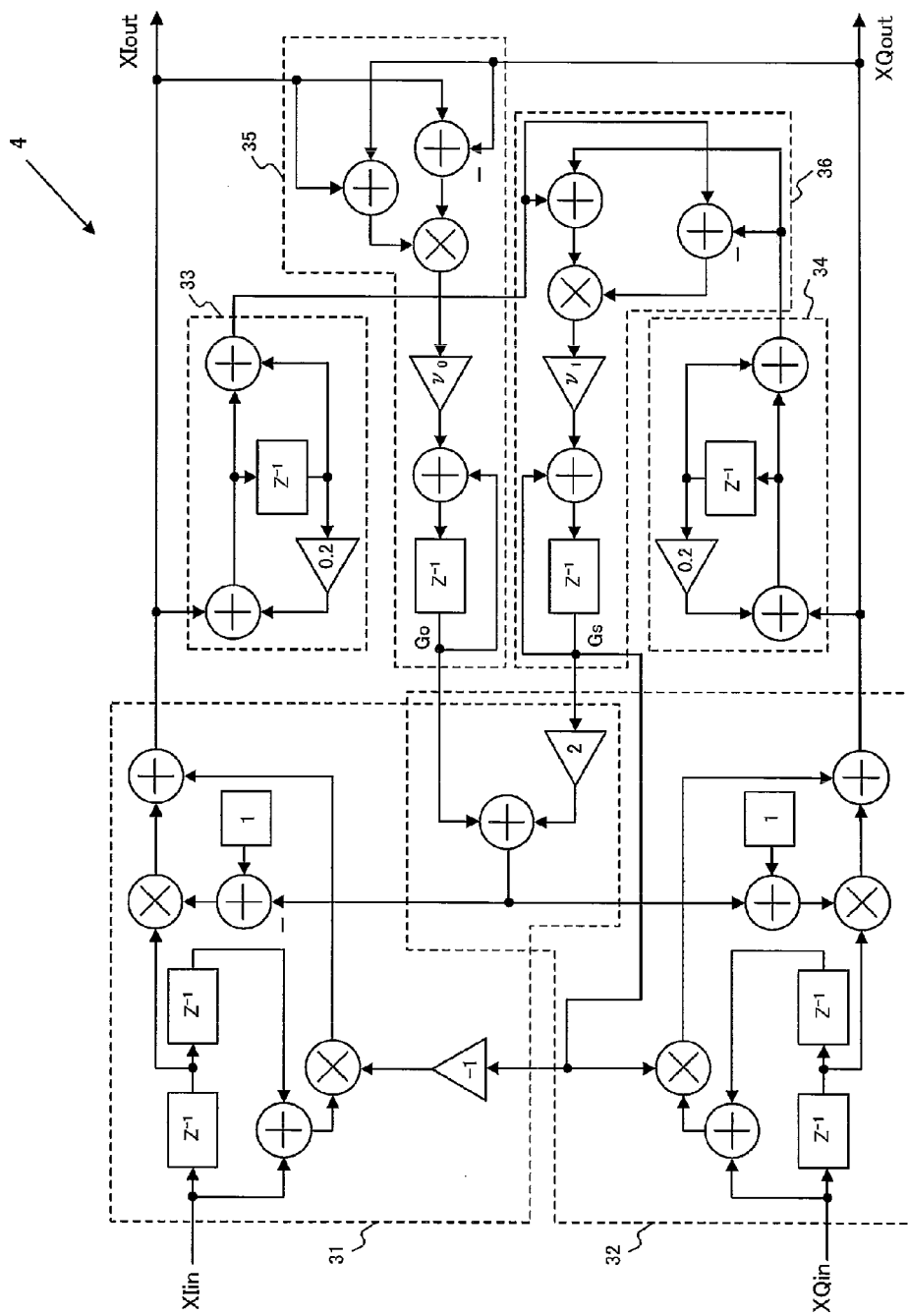
FIG. 6 is a circuit diagram showing a detailed circuit configuration of one embodiment of the IQ gain mismatch correction circuit according to the present invention.

FIG. 6 shows a more detailed circuit configuration of the IQ gain mismatch correction circuit 4. In the example shown in FIG. 6, the transfer functions of the digital filters 31 and 32 are transfer functions expressed by the equation 10. The first control circuit 35 multiplies a signal obtained by adding the output signals XIout and XQout by a signal obtained by subtracting the output signals XIout and XQout, multiplies the multiplication result by a step size parameter v0, adds the control variable Go [n] processed before one sampling period to the resultant signal, and causes the resultant signal to pass through a delay element ($z^{-1}$) to generate a control variable Go [n+1]. Similarly, the control circuit 36 multiplies a signal obtained by multiplying output signals XIm and XQm on the I-phase side and the Q-phase side of the analyzing filters 33 and 34 by a step size parameter v1, adds a control variable Gs [n] processed before one sampling period to the resultant signal, and cause the resultant signal to pass through a delay element ($z^{-1}$) to generate a control variable Gs [n+1]. The processes performed by the LMS algorithm of the control circuits 35 and 36 shown in FIG. 6 are expressed by the following equations 11 and 12.

$$Go[n+1]=Go[n]+v0\times(XIout[n]^2-XQout[n]^2) \quad (11)$$

$$Gs[n+1]=Gs[n]+v1\times(XIm[n]^2-XQm[n]^2) \quad (12)$$

In the example shown in FIG. 6, the analyzing filters 33 and 34 have the same circuit configurations and have the same circuit configurations as those of the analyzing filters 17 and 18 used in the IQ phase mismatch correction circuit 3. Therefore, the analyzing filters 33 and 34 are configured by an infinite impulse response (IIR) filters which are recursive filters having feedback loops therein. Transfer functions Ha(z) of the filter is also expressed by the above equation 5 as in the analyzing filters 17 and 18. The functions and characteristic features of the analyzing filters 33 and 34 are the same as those of the analyzing filters 17 and 18, and a repetitive description will not be given.

As described above, since the control circuits 35 and 36 operate in a time domain, the control variables Go and Gs do not require pieces of information of frequency characteristics of processing object signals, and a temporal average of IQ gain mismatch states (results of multiplication processes of the addition signals and the subtraction signals) of each pair of processing object signals are consequently obtained. Furthermore, since the analyzing filters 33 and 34 also operate in a time domain, averaging operations by different weighting coefficients are consequently performed to the control variables Go and Gs, respectively.

In the example shown in FIG. 6, with the above circuit configuration, IQ gain mismatches between the output signals XIout and XQout are sequentially corrected in a time domain with respect to the input signals XIin and XQin as expressed by the following equations 13 and 14.

$$XIout[n]=(1-Go[n]-2\times Gs[n])\times XIin[n-1]-Gs[n]\times(XIin[n]+XIin[n-2]) \quad (13)$$

$$XQout[n]=(1+Go[n]+2\times Gs[n])\times XQin[n-1]-Gs[n]\times(XQin[n]+XQin[n-2]) \quad (14)$$

In the present embodiment, the orders of the digital filters 31 and 32 are 2. However, the orders can be arbitrarily changed depending on the type of IQ mismatch that a communication link is expected to sustain and the desired performance of the IQ mismatch correction circuit.

Figure 7:
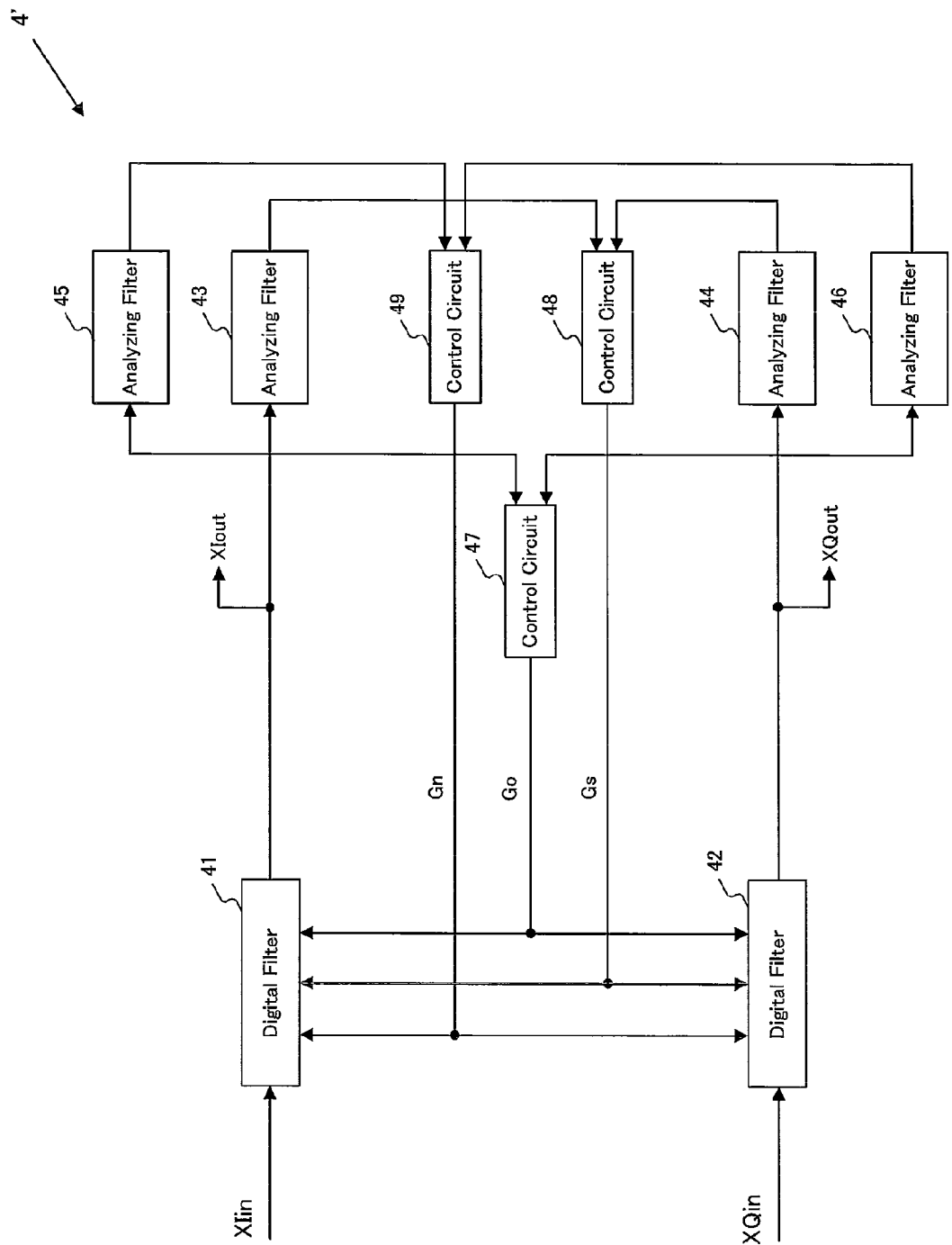
FIG. 7 is a block diagram showing a schematic configuration of another embodiment of the IQ gain mismatch correction circuit according to the present invention.

FIG. 7 shows another example of the IQ gain mismatch correction circuit 4 shown in FIG. 5. An IQ gain mismatch correction circuit 4' shown in FIG. 7 includes one pair of digital filters 41 and 42, two pairs of analyzing filters 43 to 46, and three control circuits 47 to 49 which execute the LMS algorithm. The digital filters 41 and 42 have orders which are higher than those of the digital filters 31 and 32 of the IQ gain mismatch correction circuit 4 shown in FIG. 5, and are configured as fourth-order filters having symmetrical structures and using three control variables Go, Gs, and Gn. In comparison with the IQ gain mismatch correction circuit 4 shown in FIG. 5, in order to generate an additional control variable Gn, one pair of analyzing filters 45 and 46 and one control circuit 49 are added, and signal diversity is further generated by the analyzing filters 45 and 46. As described above, an object of the analyzing filters 33, 34, and 43 to 46 is to generate the signal diversity. Therefore, as long as the signal diversity can be realized, design freedom to an architecture of an analyzing filter is extremely high. Furthermore, configurations of the analyzing filters can vary while executing essentially the same task and generating the same result. A concrete example in which the first to third control variables Go, Gs, and Gn are used as coefficients of transfer functions of the digital filters 41 and 42 is expressed by the following equation 15.

$$Hi(z)=(1-Go+2\times Gn)\times z^{-2}-Gs\times(z^{-1}+z^{-3})-Gn\times(1+z^{-4})$$

$$Hq(z)=(1+Go-2\times Gn)\times z^{-2}+Gs\times(z^{-1}+z^{-3})+Gn\times(1+z^{-4}) \quad (15)$$

Another Embodiment of IQ Mismatch Correction Circuit

When the IQ phase mismatch correction circuit 3 shown in FIG. 2 and the IQ gain mismatch correction circuit 4 shown in FIG. 5 or the IQ phase mismatch correction circuit 3' shown in FIG. 4 and the IQ gain mismatch correction circuit 4' shown in FIG. 7 are compared with each other, each of the IQ phase mismatch correction circuits 3 and 3' and each of the IQ gain mismatch correction circuits 4 and 4' have circuit configurations including the same analyzing filters and the same control circuits which execute the LMS algorithm. Therefore, in order to further reduce a circuit scale and further reduce a power consumption in operation, an analyzing filter group may be shared by the IQ phase mismatch correction circuits 3 and 3' and the IQ gain mismatch correction circuits 4 and 4' to realize common signal diversity.

The number of control variables used in the IQ phase mismatch correction circuits 3 and 3' and the IQ gain mismatch correction circuits 4 and 4' are not limited, and can be adjusted depending on a request for circuit design or performance. One advantage of the present invention is that the complexity of the circuit, i.e., the circuit scale is basically in proportion to the number of control variables. In other words, the IQ mismatch correction circuit is advantageous in that, even though the number of control variables increases, the circuit scale does not increase in proportion to the square of the increase in number or does not increase at an exponential rate.

Figure 8:
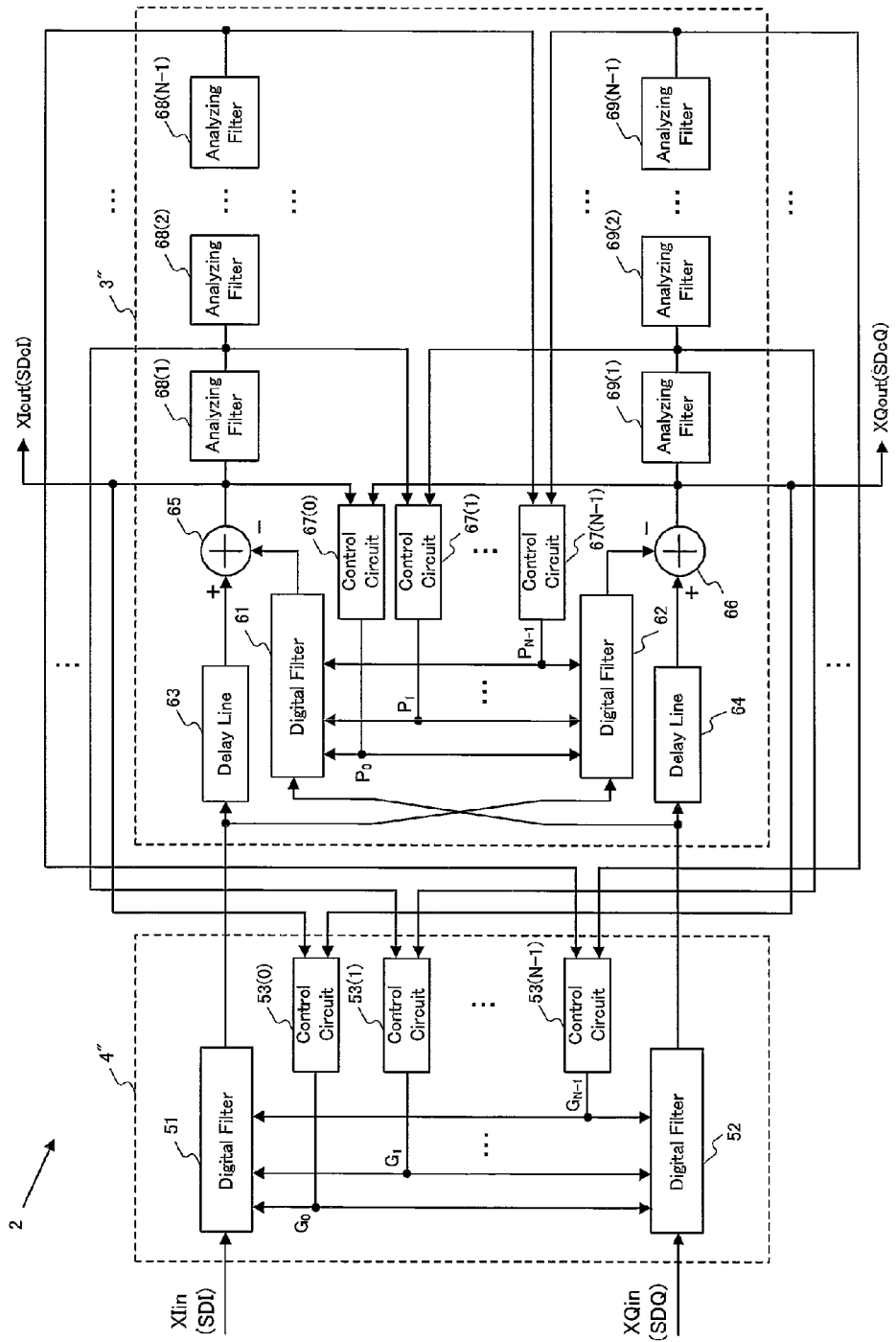
FIG. 8 is a block diagram showing a schematic configuration of another embodiment of the IQ mismatch correction circuit according to the present invention.

FIG. 8 shows another circuit configuration of the IQ mismatch correction circuit 2. In the example shown in FIG. 8, an IQ gain mismatch correction circuit 4" is arranged in an upstream stage, and an IQ phase mismatch correction circuit 3" is arranged in a downstream stage. The IQ gain mismatch correction circuit 4" includes one pair of digital filters 51 and 52 and N (N is a natural number which is 2 or more) control circuits 53(0) to 53(N−1) which execute the LMS algorithm. The IQ phase mismatch correction circuit 3″ includes one pair of digital filters 61 and 62, one pair of delay lines 63 and 64, one pair of subtractors 65 and 66, N control circuits 67(0) to 67(N−1) which execute the LMS algorithm, and (N−1) pairs of analyzing filters 68(1) to 68(N−1) and 69(1) to 69(N−1). The input signals XIin and XQin are inputted to the pair of digital filters 51 and 52 of the IQ gain mismatch correction circuit 4″, respectively, and the output signals XIout and XQout are outputted from the subtractors 65 and 66 of the IQ phase mismatch correction circuit 3″, respectively.

In the example shown in FIG. 8, the IQ gain mismatch correction circuit 4″ uses N control variables $G_0$ to $G_{N-1}$, and the IQ phase mismatch correction circuit 3″ uses N control variables $P_0$ to $P_{N-1}$. The IQ gain mismatch correction circuit 4″ uses the analyzing filters 68(1) to 68(N−1) and 69(1) to 69(N−1) of the IQ phase mismatch correction circuit 3″ in common. In the present example, the output signals XIout and XQout are inputted to the first-stage control circuit 53(0) of the IQ gain mismatch correction circuit 4″ and the first-stage control circuit 67(0) of the IQ phase mismatch correction circuit 3″, respectively, to generate first control variables $G_0$ and $P_0$. The (N−1) pairs of analyzing filters 68(1) to 68(N−1) and 69(1) to 69(N−1) are sequentially connected in a row. The output signals XIout and XQout are inputted to the first pair of analyzing filters 68(1) and 69(1), respectively, and I-phase and Q-phase output signals between which signal diversity is generated are inputted to the second-stage control circuit 53(1) of the IQ gain mismatch correction circuit 4″ and the second-stage control circuit 67(1) of the IQ phase mismatch correction circuit 3″, respectively, to generate second control variables G1 and P1. Similarly, to the i th pair (i=2 to N−1) of analyzing filters 68(i) and 69(i), output signals from the (i−1)th pair of analyzing filters 68(i−1) and 69(i−1) are inputted, respectively. I-phase and Q-phase output signals between which signal diversity is generated are inputted to the (i+1)th-stage control circuit 53(i) of the IQ gain mismatch correction circuit 4″ and the (i+1)th-stage control circuit 67(i) of the IQ phase mismatch correction circuit 3″, respectively, to generate the (i+1)th control variables Gi and Pi.

Another Embodiment

In the above embodiment, the order of the digital filter of the IQ phase mismatch correction circuit 3 and the order of the digital filter of the IQ gain mismatch correction circuit 4 need not be equal to each other. For example, in the example shown in FIG. 8, the orders of the digital filters 51 and 52 of the IQ gain mismatch correction circuit 4″ in the upstream stage may be smaller than the orders of the digital filters 61 and 62 of the IQ phase mismatch correction circuit 3″ in the downstream stage. In this case, the number of control variables used in the IQ gain mismatch correction circuit 4″ in the upstream stage may be set to be less than N, some of the control circuits 53(0) to 53(N−1) may be omitted, and only some of the (N−1)th pairs of analyzing filters 68(1) to 68(N−1) and 69(1) to 69(N−1) may be used.

Furthermore, the above embodiment describes the configuration in which the IQ mismatch correction circuit 2 and the receiving apparatus 1 include both the IQ phase mismatch correction circuit 3 and the IQ gain mismatch correction circuit 4. However, a configuration in which only one of the IQ phase mismatch correction circuit 3 and the IQ gain mismatch correction circuit 4 may be arranged with a request for performance or the like required for the IQ mismatch correction circuit.

The present invention can be used in correction of an IQ mismatch between I-phase and Q-phase digital baseband signals outputted from an orthogonal receiver in a digital communication system.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. An IQ phase mismatch correction circuit arranged to correct an IQ mismatch between I-phase and Q-phase digital baseband signals, the IQ phase mismatch correction circuit comprising:
    a first digital filter arranged to perform a first or higher order digital filtering process to an I-phase input signal in a time domain;
    a second digital filter arranged to perform a first or higher order digital filtering process to a Q-phase input signal in the time domain;
    two or more control circuits arranged to independently generate two or more control variables to derive two or more coefficients of the transfer functions of the first and second digital filters in the time domain, and supply the control variables to the first and second digital filters; and
    one or more pairs of analyzing filters arranged to change frequency characteristics of an I-phase output signal and a Q-phase output signal so that the frequency characteristics are different from those of original signals, respectively, the I-phase output signal being a differential signal or a composite signal between a delayed signal of the I-phase input signal and an output signal from the second digital filter, the Q-phase output signal being a differential signal or a composite signal between a delayed signal of the Q-phase input signal and an output signal from the first digital filter, wherein
    a first control circuit of the two or more control circuits is configured to measure a temporally averaged IQ phase mismatch state between the I-phase output signal and the Q-phase output signal, and to feed back the IQ phase mismatch state to the first and second digital filters as a first variable, which is one of the two or more control variables, and
    a second control circuit other than the first control circuit of the two or more control circuits is configured to measure a temporally averaged IQ phase mismatch state between output signals on an I-phase side and a Q-phase side of one corresponding pair of analyzing filters of the one or more pairs of analyzing filters, and to feed back the IQ phase mismatch state to the first and second digital filters as a second variable, which is another one of the two or more control variables.

2. The IQ phase mismatch correction circuit according to claim 1, wherein
    when a number of the control variables is not less than 3 and the one or more pairs of the analyzing filters is not less than 2, transfer functions of one pair of the analyzing filters and another pair of the analyzing filters are different from each other.

3. The IQ phase mismatch correction circuit according to claim 1, wherein
    each of the two or more control circuits performs a multiplying process to I-phase and Q-phase processing object signals in the time domain, and sequentially executes adapting processes for the control variables by a least mean square algorithm by using a result of the multiplying process.

4. The IQ phase mismatch correction circuit according to claim 1, wherein each of the first and second digital filters is a finite impulse response filter having a second or higher order symmetric structure.

5. The IQ phase mismatch correction circuit according to claim 1, wherein the analyzing filters are infinite impulse response filters.

6. An IQ gain mismatch correction circuit arranged to correct an IQ gain mismatch between I-phase and Q-phase digital baseband signals, the IQ gain mismatch correction circuit comprising:

a first digital filter arranged to perform a first or higher order digital filtering process to an I-phase input signal in a time domain;

a second digital filter arranged to perform a first or higher order digital filtering process to a Q-phase input signal in the time domain, the second digital filter having a transfer function different from that of the first digital filter;

two or more control circuits arranged to independently generate two or more control variables to derive two or more coefficients of the transfer functions of the first and second digital filters in the time domain, and feed back the control variables to the first and second digital filters; and one or more pairs of analyzing filters arranged to change frequency characteristics of an I-phase output signal and a Q-phase output signal so that the frequency characteristics are different from those of original signals, respectively, the I-phase output signal being an output signal from the first digital filter, the Q-phase output signal being an output signal of the Q-phase input signal, wherein a first control circuit of the two or more control circuits is configured to measure a temporally averaged IQ gain mismatch state between the I-phase output signal and the Q-phase output signal, and to feed back the IQ gain mismatch state to the first and second digital filters as a first variable, which is one of the two or more control variables, and a second control circuit other than the first control circuit of the two or more control circuits is configured to measure a temporally averaged IQ gain mismatch state between output signals on an I-phase side and a Q-phase side of one corresponding pair of analyzing filters of the one or more pairs of analyzing filters, and to feed back the IQ gain mismatch state to the first and second digital filters as a second variable, which is another one of the two or more control variables.

7. The IQ gain mismatch correction circuit according to claim 6, wherein when a number of the control variables is not less than 3 and a the one or more pairs of the analyzing filters is not less than 2, transfer functions of one pair of the analyzing filters and another pair of the analyzing filters are different from each other.

8. The IQ gain mismatch correction circuit according to claim 6, wherein each of the two or more control circuits performs a subtracting process and an adding process to I-phase and Q-phase processing object signals in the time domain and a multiplying process to results of the subtracting process and the adding process, and sequentially executes adapting processes to the control variables by a least mean square algorithm by using a result of the multiplying process.

9. The IQ gain mismatch correction circuit according to claim 6, wherein each of the first and second digital filters is a finite impulse response filter having a second or higher order symmetric structure.

10. The IQ gain mismatch correction circuit according to claim 6, wherein the analyzing filters are infinite impulse response filters.

11. An IQ mismatch correction circuit comprising:

the IQ phase mismatch correction circuit according to claim 1; and an IQ gain mismatch correction circuit arranged to correct an IQ gain mismatch between I-phase and Q-phase digital baseband signals, the IQ gain mismatch correction circuit comprising:

a first digital filter arranged to perform a first or higher order digital filtering process to an I-phase input signal in a time domain;

a second digital filter arranged to perform a first or higher order digital filtering process to a Q-phase input signal in the time domain, the second digital filter having a transfer function different from that of the first digital filter;

two or more control circuits arranged to independently generate two or more control variables to derive two or more coefficients of the transfer functions of the first and second digital filters in the time domain, and feed back the control variables to the first and second digital filters; and one or more pairs of analyzing filters arranged to change frequency characteristics of an I-phase output signal and a Q-phase output signal so that the frequency characteristics are different from those of original signals, respectively, the I-phase output signal being an output signal from the first digital filter, the Q-phase output signal being an output signal of the Q-phase input signal, wherein a first control circuit of the two or more control circuits is configured to measure a temporally averaged IQ gain mismatch state between the I-phase output signal and the Q-phase output signal, and to feed back the IQ gain mismatch state to the first and second digital filters as a first variable, which is one of the two or more control variables, and a second control circuit other than the first control circuit of the two or more control circuits is configured to measure a temporally averaged IQ gain mismatch state between output signals on an I-phase side and a Q-phase side of one corresponding pair of analyzing filters of the one or more pairs of analyzing filters, and to feed back the IQ gain mismatch state to the first and second digital filters as a second variable, which is another one of the two or more control variables, wherein the IQ phase mismatch correction circuit and the IQ gain mismatch correction circuit are connected in a row such that one of the IQ phase mismatch correction circuit and the IQ gain mismatch correction circuit is at an upstream stage as an upstream circuit and the other is at a downstream stage as a downstream circuit, I-phase and Q-phase digital baseband signals are inputted as I-phase and Q-phase input signals of the upstream circuit, I-phase and Q-phase output signals of the upstream circuit are inputted as I-phase and Q-phase input signals of the downstream circuit, and I-phase and Q-phase output signals of the downstream circuit are outputted as I-phase and Q-phase digital baseband signals after IQ mismatch correction.

12. The IQ mismatch correction circuit according to claim 11, wherein the one or more pairs of analyzing filters of the downstream circuit are commonly used as the one or more pairs of analyzing filters of the upstream circuit.

13. A receiving apparatus comprising the IQ phase mismatch correction circuit according to claim 1 in a downstream stage of an orthogonal receiver.

14. A receiving apparatus comprising the IQ gain mismatch correction circuit according to claim 6 in a downstream stage of an orthogonal receiver.

15. A receiving apparatus comprising the IQ mismatch correction circuit according to claim 11 in a downstream stage of an orthogonal receiver.

* * * * *